United States Patent
Park et al.

(10) Patent No.: US 7,652,931 B2
(45) Date of Patent: Jan. 26, 2010

(54) NONVOLATILE MEMORY DEVICE WITH NAND CELL STRINGS

(75) Inventors: Ki-Tae Park, Suwon-si (KR); Jung-Dal Choi, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 134 days.

(21) Appl. No.: 11/657,696

(22) Filed: Jan. 25, 2007

(65) Prior Publication Data

US 2008/0007999 A1    Jan. 10, 2008

(30) Foreign Application Priority Data

Jul. 10, 2006    (KR) .................. 10-2006-0064525

(51) Int. Cl.
*G11C 16/04* (2006.01)

(52) U.S. Cl. .................. 365/185.29; 365/185.2; 365/185.11; 365/185.16

(58) Field of Classification Search ............ 365/185.29, 365/185.2, 185.11, 185.16
See application file for complete search history.

(56) References Cited

U.S. PATENT DOCUMENTS

| | | | |
|---|---|---|---|
| 6,344,994 B1 | 2/2002 | Hamilton et al. | |
| 6,788,602 B2 | 9/2004 | Huang et al. | |
| 7,079,437 B2 * | 7/2006 | Hazama et al. | 365/210.12 |
| 7,239,556 B2 * | 7/2007 | Abe et al. | 365/185.33 |
| 2005/0180213 A1 * | 8/2005 | Abe et al. | 365/185.17 |
| 2007/0058428 A1 * | 3/2007 | Kang et al. | 365/185.02 |
| 2007/0159886 A1 * | 7/2007 | Kang | 365/185.17 |
| 2007/0247909 A1 * | 10/2007 | Kamei | 365/185.17 |

FOREIGN PATENT DOCUMENTS

| | | | |
|---|---|---|---|
| JP | 11-177071 | 7/1999 | |
| JP | 11-273368 | 10/1999 | |
| JP | 2001-143483 | 5/2001 | |
| JP | 2005-116119 | 4/2005 | |
| KR | 200602310 | * 1/2006 | 365/185.17 |

* cited by examiner

*Primary Examiner*—Thong Q Le
(74) *Attorney, Agent, or Firm*—Volentine & Whitt, PLLC

(57) ABSTRACT

A nonvolatile memory device comprises a memory cell array wherein a plurality of memory cell transistors are divided into multiple erase blocks. The multiple erase blocks are separated from each other by dummy word lines. During an erase operation of one of the multiple blocks, a dummy word line separating the one of the multiple blocks from other erase blocks is driven with a coupling inhibition voltage.

19 Claims, 11 Drawing Sheets

Fig. 4

|         | Program | Read  | Erase    | Erase Verify |
|---------|---------|-------|----------|--------------|
| SSL     | Vcc     | Vread | Floating | Vread        |
| GSL     | 0V      | Vread | Floating | Vread        |
| WL_sel  | Vpgm    | Vr    | 0V       | 0V           |
| WL_nosel| Vpass   | Vread | Floating | Vread        |
| WL_dummy| Vpass   | Vread | Vdec     | Vread        |
| BL_sel  | 0V      | Vbl   | Floating | Vbl          |
| BL_nosel| Vcc     | 0V    | Floating | 0V           |
| CSL     | 0V      | 0V    | Floating | 0V           |
| Bulk    | 0V      | 0V    | 20V      | 0V           |

|  | Program | Read | Erase | Erase Verify |
|---|---|---|---|---|
| SSL | Vcc | Vread | Floating | Vread |
| GSL | 0V | Vread | Floating | Vread |
| WL_sel | Vpgm | Vr | 0V | 0V |
| WL_nosel | Vpass | Vread | Floating | Vread |
| WL_dummy1 | Vpass | Vread | Vdec1 | Vread |
| WL_dummy2 | Vpass | Vread | Vdec2 | Vread |
| BL_sel | 0V | Vbl | Floating | Vbl |
| BL_nosel | Vcc | 0V | Floating | 0V |
| CSL | 0V | 0V | Floating | 0V |
| Bulk | 0V | 0V | 20V | 0V |

|  | Program | Read | Erase | Erase Verify |
|---|---|---|---|---|
| SSL | Vcc | Vread | Floating | Vread |
| GSL | 0V | Vread | Floating | Vread |
| WL_sel | Vpgm | Vr | 0V | 0V |
| WL_nosel | Vpass | Vread | Floating | Vread |
| WL_dummy | Vpass | Vread | Vdec1 | Vread |
| WLd_sel | Vpass | Vread | Vdec2 | Vread |
| WLd_nosel | Vpass | Vread | Floating | Vread |
| BL_sel | 0V | Vbl | Floating | Vbl |
| BL_nosel | Vcc | 0V | Floating | 0V |
| CSL | 0V | 0V | Floating | 0V |
| Bulk | 0V | 0V | 20V | 0V |

Fig. 10

|              | Program | Read  | Erase    | Erase Verify |
|--------------|---------|-------|----------|--------------|
| SSL          | Vcc     | Vread | Floating | Vread        |
| GSL          | 0V      | Vread | Floating | Vread        |
| WL_sel       | Vpgm    | Vr    | 0V       | 0V           |
| WL_nosel     | Vpass   | Vread | Floating | Vread        |
| WL_dummy1    | Vpass   | Vread | Vdec1    | Vread        |
| WL_dummy2    | Vpass   | Vread | Vdec2    | Vread        |
| WLd_sel      | Vpass   | Vread | Vdec3    | Vread        |
| WLd_nosel    | Vpass   | Vread | Floating | Vread        |
| BL_sel       | 0V      | Vbl   | Floating | Vbl          |
| BL_nosel     | Vcc     | 0V    | Floating | 0V           |
| CSL          | 0V      | 0V    | Floating | 0V           |
| Bulk         | 0V      | 0V    | 20V      | 0V           |

NONVOLATILE MEMORY DEVICE WITH NAND CELL STRINGS

BACKGROUND OF THE INVENTION

1. Field of the Invention

Embodiments of the invention relate generally to semiconductor memory devices. More particularly, embodiments of the invention relate to NAND-type nonvolatile semiconductor memory devices including dummy cells.

A claim of priority is made to Korean Patent Application No. 2006-64525 filed on Jul. 10, 2006, the disclosure of which is hereby incorporated by reference in its entirety.

2. Description of Related Art

A NAND-type nonvolatile memory device comprises a memory cell array comprising a plurality of nonvolatile memory cells arranged in a plurality of strings. The strings in a NAND-type nonvolatile memory device are commonly referred to as NAND cell stings, or NAND strings for short. In a typical NAND string, a plurality of nonvolatile memory cells are connected to each other in series between a common source line and a bit line. The memory cells in each NAND string are connected to the bit line through a string select transistor and to the common select line CSL through a ground select transistor.

In order to increase the integration density of NAND-type nonvolatile memory devices, researchers continue to develop new ways of shrinking the size and separating distance of elements in the devices. In addition, another way to increase the integration density of NAND-type nonvolatile memory devices is by including more memory cell transistors in each NAND string. By increasing the number of memory cell transistors per string, the relative proportion of chip area occupied by control elements such as the ground select transistor and the string select transistor, as opposed to the proportion occupied by memory elements, tends to decrease. As a result, adding more memory cells per NAND string tends to increase the data storage capacity per chip area of a NAND-type nonvolatile memory device.

FIG. 1 shows a NAND-type nonvolatile memory device comprising several NAND cell strings each comprising 32 memory cell transistors. FIG. 2, on the other hand, shows a NAND-type nonvolatile memory device comprising several NAND cell strings each comprising 64 memory cell transistors.

Referring to FIG. 1, the NAND-type nonvolatile memory device comprises a plurality of cell arrays, each comprising a memory field MEM and a selection field SELi, where "i" is an integer equal to 1, 2, or 3. The cell arrays are arranged in a mirror pattern where each pair of adjacent cell arrays shares a selection field SELi.

Each memory field MEM in FIG. 1 comprises a plurality of NAND strings. Each of the NAND strings comprises 32 memory cell transistors Tc connected in series between a string select transistor Ts in one of selection fields SEL1 or SEL3, and a ground select transistor in selection field SEL2. The NAND strings are arranged in columns, and respective memory cell transistors Tc within the NAND strings align to form rows, where each row of memory cell transistors Tc is commonly connected to one of a plurality of word lines WL00 through WL31. A row of memory cells transistors Tc commonly connected to a word line will be referred to hereafter as a "page" of memory cells. Often, a NAND-type memory array will be programmed by a unit of an entire page at a time.

Each of the NAND strings in FIG. 1 is connected to a corresponding one of a plurality of bitlines BL00 through BLn via its string select transistor Ts. In addition, each of the NAND strings is connected to a common select line CSL via its ground select transistor Tg.

The NAND-type nonvolatile memory device illustrated in FIG. 2 is similar to the NAND-type nonvolatile memory device illustrated in FIG. 1, except that in FIG. 2, each NAND string includes 64 memory cells connected in series between a ground select transistor Tg in selection field SEL1 and a string select transistor Ts in selection field SEL2.

Because the NAND-type semiconductor memory device of FIG. 2 dedicates a relatively smaller area to selection fields than the NAND-type semiconductor memory device of FIG. 1, the NAND-type semiconductor memory device of FIG. 2 can provide a higher amount of data storage per chip area than the NAND-type semiconductor memory device of FIG. 1.

Unfortunately, however, most NAND-type nonvolatile memory devices perform erase operations in units of entire arrays, also called "blocks". In other words, all of the NAND strings located in the same memory field MEM are usually erased at the same time. As a result, increasing the number of memory cells per NAND string may have the undesirable side effect of creating a more cumbersome, less flexible file system. As a result, even though such devices may be able to achieve a higher integration density, this benefit may be offset by a decreased efficiency due to the coarser granularity of erase operations.

SUMMARY OF THE INVENTION

According to one embodiment of the invention, a nonvolatile memory device comprises a memory cell array. The memory cell array comprises a plurality of NAND strings, wherein each NAND string comprises a plurality of memory cell transistors connected in series, and a first dummy transistor connected in series between two of the plurality of memory cell transistors. The first dummy transistors in the plurality of NAND strings divide the memory cell array into multiple blocks. In addition, during an erase operation of a selected one of the multiple blocks, a coupling inhibition voltage is applied to respective gate electrodes of the first dummy transistors in the plurality of NAND cell strings.

According to another embodiment of the invention, a nonvolatile memory device comprises a memory cell array. The memory cell array comprises ground and string select lines formed on a semiconductor substrate and extending along a first direction and a plurality of word lines formed on the semiconductor substrate between the ground and string select lines. At least one of the word lines is controlled as a dummy word line and divides the memory cell array into multiple blocks, wherein during an erase operation of a selected one of the multiple blocks, a coupling inhibition voltage is applied to the at least one of the word lines controlled as a dummy word line.

BRIEF DESCRIPTION OF THE DRAWINGS

Embodiments of the invention are described below in relation to the accompanying drawings. Throughout the drawings like reference numbers indicate like exemplary elements, components, and steps. In the drawings:

FIG. 4 is a table illustrating voltage conditions for various operations of the NAND-type nonvolatile memory device illustrated in FIGS. 3A through 3C;

FIG. 10 is a table illustrating voltage conditions for various operations of the NAND-type nonvolatile memory device illustrated in FIGS. 9A through 9C.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
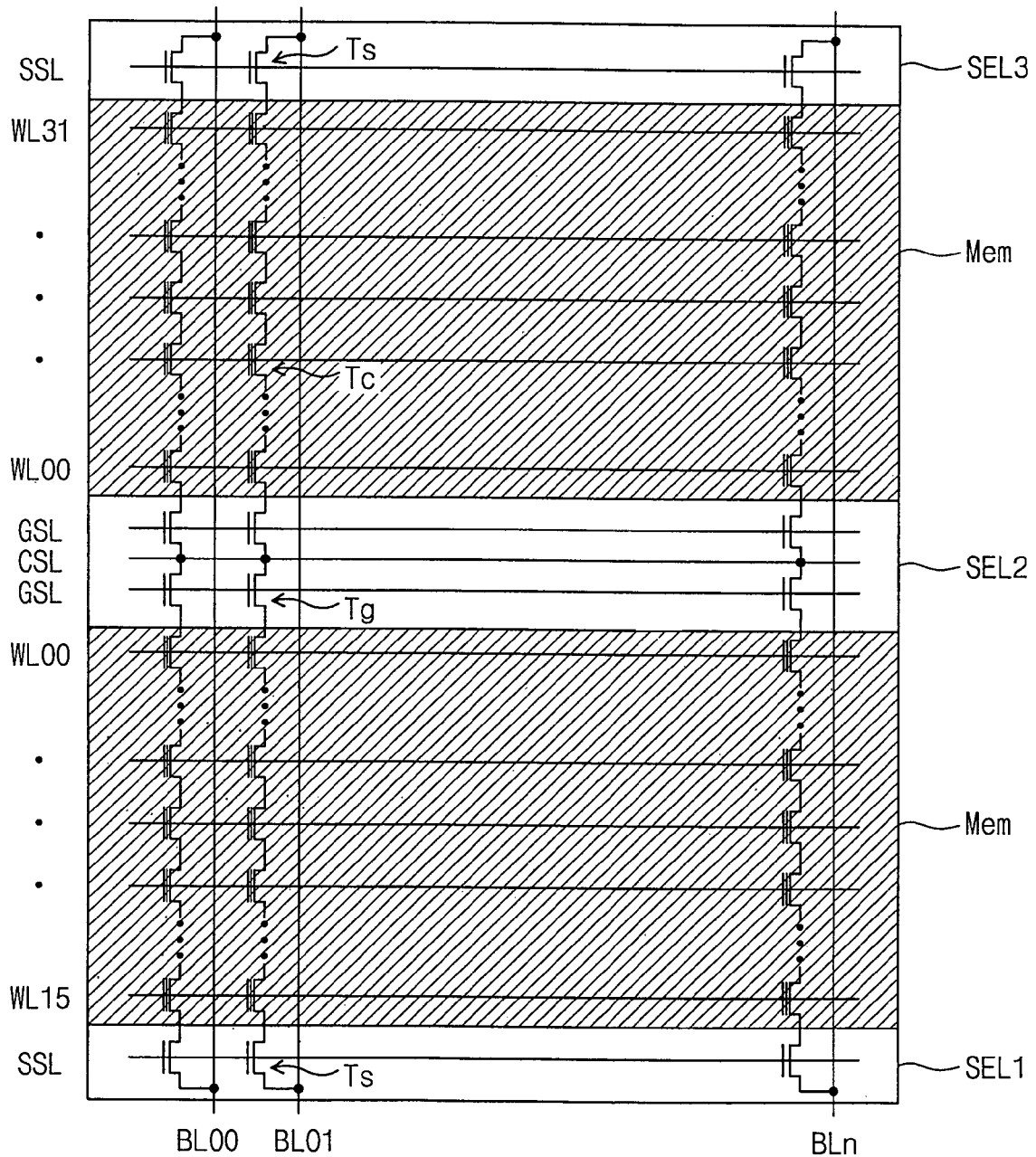
FIGS. 1 and 2 are circuit diagrams illustrating conventional NAND cell arrays for NAND-type nonvolatile memory devices.
Figure 2:
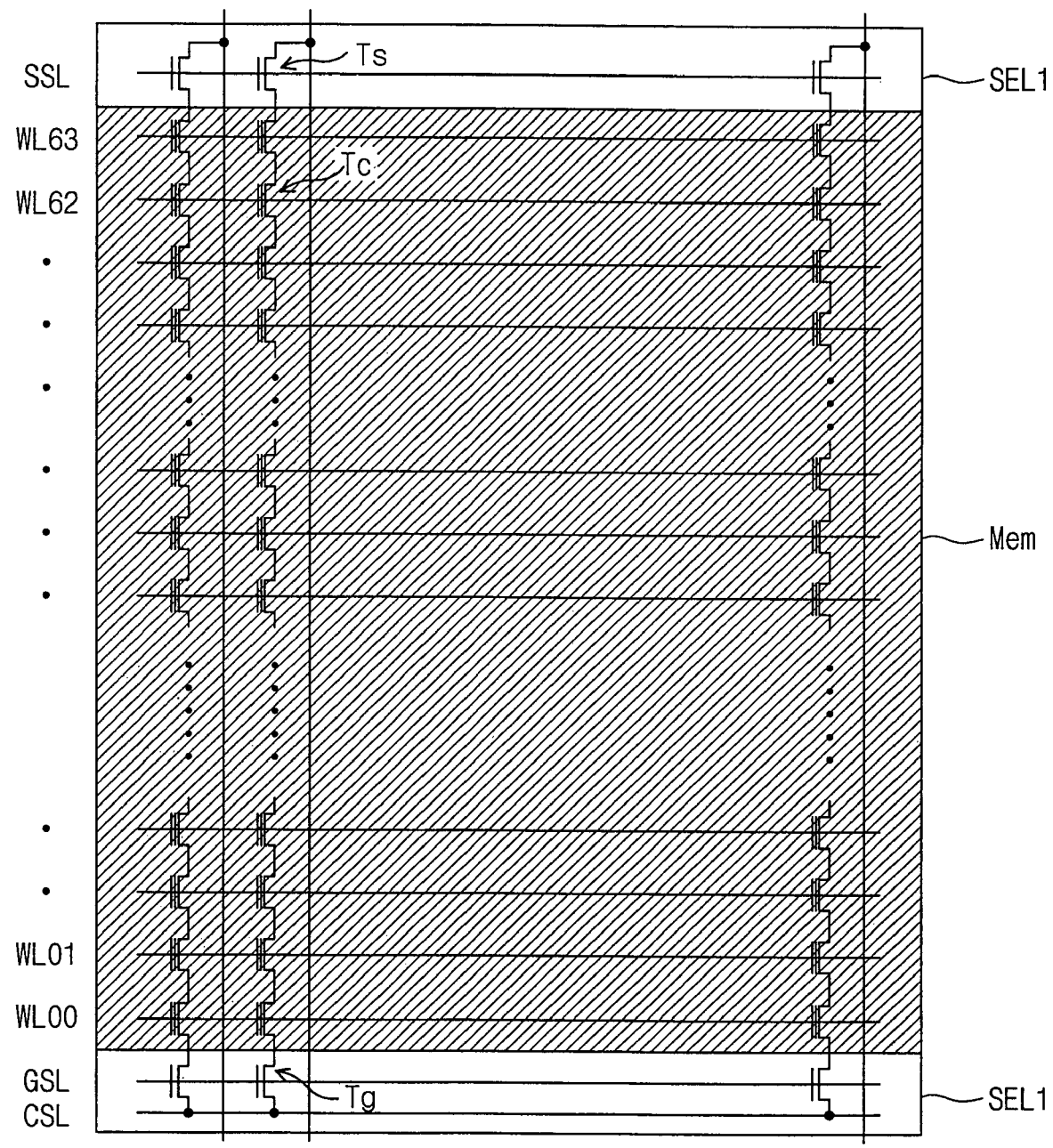
Figure 3A:
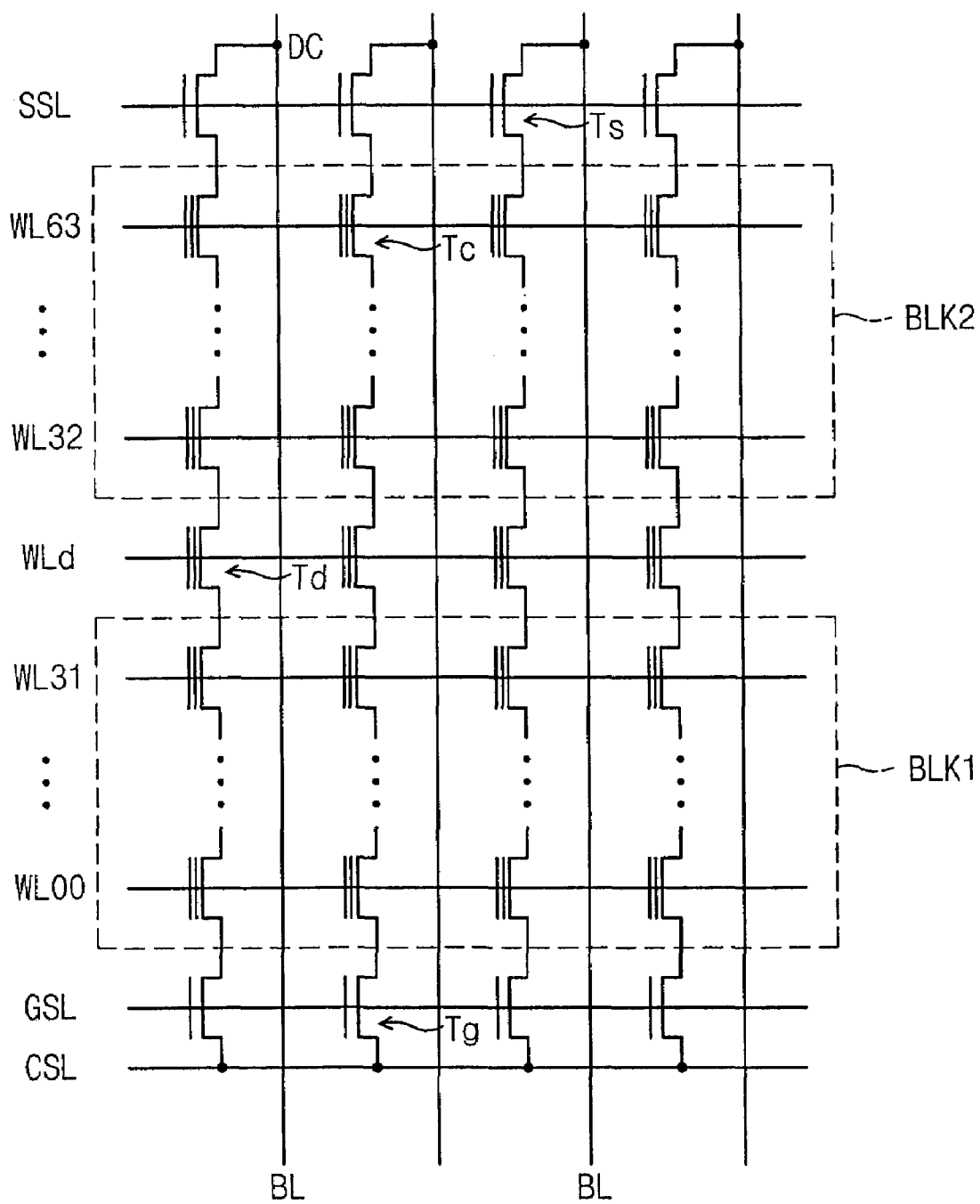
FIGS. 3A through 3C are circuit and sectional diagrams illustrating a NAND-type nonvolatile memory device in accordance with one embodiment of the invention.
Figure 3B:
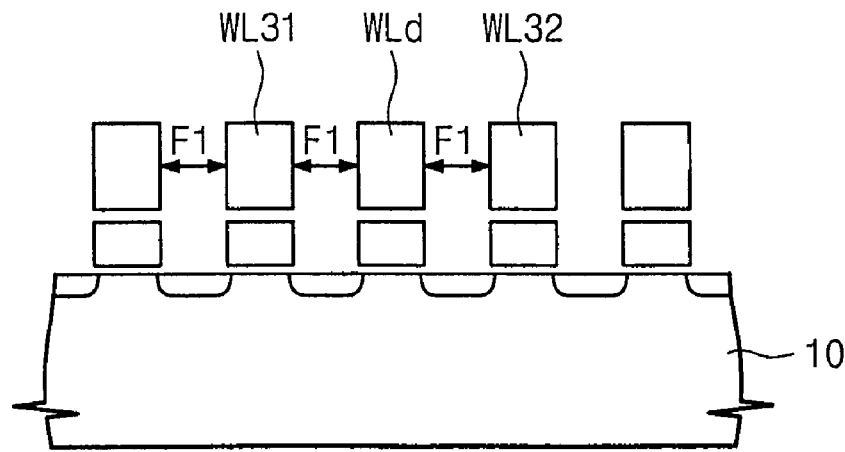

FIG. 3A is a circuit diagram illustrating a memory cell array of a NAND-type nonvolatile memory device in accordance with an embodiment of the present invention, and FIG. 3B is a sectional diagram illustrating the NAND-type nonvolatile memory device of FIG. 3A.

Referring to FIG. 3A, the memory cell array of the NAND-type nonvolatile memory device comprises a plurality of NAND strings, wherein each NAND string comprises a plurality of memory cell transistors Tc connected in series between a ground select transistor Tg and a string select transistor Ts. The ground select transistor Tg in each NAND string is connected between the memory cell transistors Tc and a common source line CSL. The string select transistor Ts is connected between the memory cell transistors Tc and a bit line BL. The connection between the string select transistor Ts and the common source line CSL is made in a common source region and the connection between the ground select transistor Tg and the bit line is made in a bit line connection region DC.

In the memory cell array, common source line CSL connects common source regions corresponding to different NAND strings. A ground select line GSL connects respective gate electrodes of the gate select transistors Tg in different NAND strings to each other. Similarly, a string select line SSL connects respective gate electrodes of the string select transistors Tg in different NAND strings to each other. Finally, word lines WL00 through WL63 connect respective gate electrodes of memory cell transistors Tc in rows of the memory cell array to each other. For example, the gate electrodes of memory cells in a row 00 of the memory cell array are all connected to word line WL00, and so on.

In addition to the transistors described above, each NAND string in the memory cell array further comprises at least one dummy transistor Td. In the example of FIG. 3A, the at least one dummy transistor Td in each NAND string is connected between rows 31 and 32 of memory cell transistors Tc so that the memory cell array is divided into two separate erase blocks BLK1 and BLK2. A dummy word line WLd connects respective gate electrodes of the dummy cells Td to each other.

Although the example of FIG. 3A shows the memory cell array with 64 pages and dummy cell transistors Td located between rows 31 and 32 of the memory cell transistors Tc, other embodiments could include different numbers of pages of memory cell transistors Tc and different numbers of dummy cells Td per NAND string. For instance, the memory cell array could include 128 or 256 pages of memory cell transistors with a row of dummy cells located between each 16 or 32 pages of memory cell transistors Tc. In such cases, there could be many more separate erase blocks than illustrated in FIG. 3A.

Referring to FIG. 3B, the memory cell array is formed on a semiconductor substrate 10. Dummy word line WLd is formed on semiconductor substrate 10 to divide word lines WL00 through WL63 into erase blocks BLK1 and BLK2. Dummy word line WLd is formed with substantially the same structure as word lines WL00 through WL63. Dummy word line WLd and word lines WL00 through WL64 may be arranged with a predetermined pitch from each other. In addition, word lines WL00 through WL63 may be separated from each other by a minimum feature size F1. Moreover, dummy word line WLd may be separated from word lines WL31 and WL32 by minimum feature size F1.

According to selected embodiments of the invention, blocks BLK1 and BLK2 are erased independently from each other. Dummy word line WLd functions to prevent disturbance in memory cell transistors on the boundary of other blocks that are being erased. For example, dummy word line WLd prevents data stored in memory cell transistors Tc in row 31 from being modified when block BLK2 is being erased.

Figure 3C:
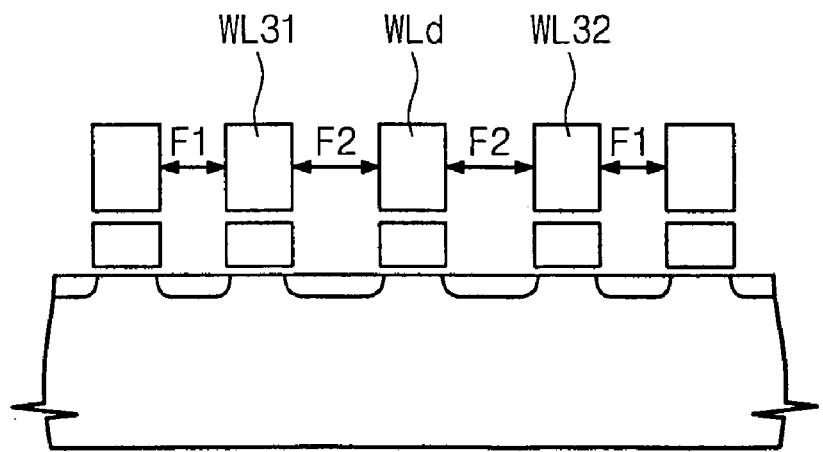

As illustrated in FIG. 3C, an interval between dummy word line WLd and word lines WL31 and WL32 may be equal to a distance F2, which is greater than minimum feature size F1. As dummy word line WLd is further separated from these word lines, dummy word line WLd becomes more effective in preventing operational disturbance between the memory cell transistors in rows 31 and 32.

FIG. 4 is a table illustrating voltages used to operate the NAND-type nonvolatile memory device illustrated in FIGS. 3A and 3B. In particular, FIG. 4 illustrates voltages for program, read, erase, and erase verify operations of the NAND-type nonvolatile memory device.

Referring to FIG. 4, during the program operation, string select line SSL is driven with a power source voltage Vcc, ground select line GSL is driven with 0V, a selected word line W_sel among word lines WL00 through WL63 is driven with a program voltage Vpgm, unselected word lines WL_nosel among word lines WL00 through WL63 are driven with a pass voltage Vpass, a dummy word line WL_dummy (i.e., dummy word line WLd) is driven with pass voltage Vpass, selected bitlines BL_sel are driven with 0V, unselected bitlines BL_nosel are driven with power source voltage Vcc, common select line CSL is driven with 0V, and a bulk of the memory cell array receives 0V.

During the read operation, string select line SSL is driven with a read voltage Vread, ground select line GSL is driven with read voltage Vread, selected word line W_sel is driven with a reference voltage Vr, unselected word lines WL_nosel are driven with read voltage Vread, dummy word line WL_dummy is driven with read voltage Vread, selected bitlines BL_sel are driven with a bit line voltage Vbl, unselected bitlines BL_nosel are driven with 0V, common select line CSL is driven with 0V, and the bulk of the memory cell array receives 0V.

During the erase operation, string select line SSL is allowed to float, ground select line GSL is allowed to float, selected word line W_sel is driven with 0V, unselected word lines WL_nosel are allowed to float, dummy word line WL_dummy is driven with a coupling inhibition voltage Vdec, selected bitlines BL_sel are allowed to float, unselected bitlines BL_nosel are allowed to float, common select line CSL is allowed to float, and the bulk of the memory cell array is driven with 20V.

During the erase verify operation, string select line SSL is driven with read voltage Vread, ground select line GSL is driven with read voltage Vread, selected word line W_sel is driven with 0V, unselected word lines WL_nosel are driven with read voltage Vread, dummy word line WL_dummy is driven with read voltage Vread, selected bitlines BL_sel are driven with bit line voltage Vbl, unselected bitlines BL_nosel are driven with 0V, common select line CSL is driven with 0V, and a bulk of the memory cell array receives 0V.

During the erase operation, coupling inhibition voltage Vdec applied to dummy word line WL_dummy acts to restrain mutual disturbance between memory cell transistors located in rows 31 and 32 of the memory cell array.

Where 20V is applied to the bulk of the memory cell array during the erase operation, potentials of floating gates in memory cell transistors Tc coupled to unselected word lines WL_nosel, which are allowed to float during the erase operation, are boosted up to inhibit erasure of memory cells connected to unselected word lines WL_nosel while memory cell transistors coupled to selected word line WL_sel are erased.

However, at a boundary between an unselected erase block and a selected erase block, electrical interactions between a selected word line closest to an unselected wordline may cause the program state of some unselected cells to be undesirably modified. Accordingly, the dummy word line is placed between the boundary of adjacent erase blocks to prevent such disturbances from taking place.

Coupling inhibition voltage Vdec preferably has an intermediate level between the voltage level applied to selected word lines WL_sel in a block being erased and the voltage level apparent at unselected word lines WL_nosel in a block not being erased. If coupling inhibition voltage Vdec is too close to the voltage level apparent at unselected word lines WL_nosel, the erase operation applied to the memory cell transistors near dummy word line WLd may be undesirably slowed down. Furthermore, the erase operation may result in undesirably large gaps between threshold voltages of the memory cell transistors in the erased block. These problems are more serious than effects caused in unselected erase blocks by increasing coupling inhibition voltage Vdec. Accordingly, coupling inhibition voltage Vdec is preferably set near to a voltage applied to selected word line WL_sel during the erase operation, e.g., 0V through Vcc.

Figure 5A:
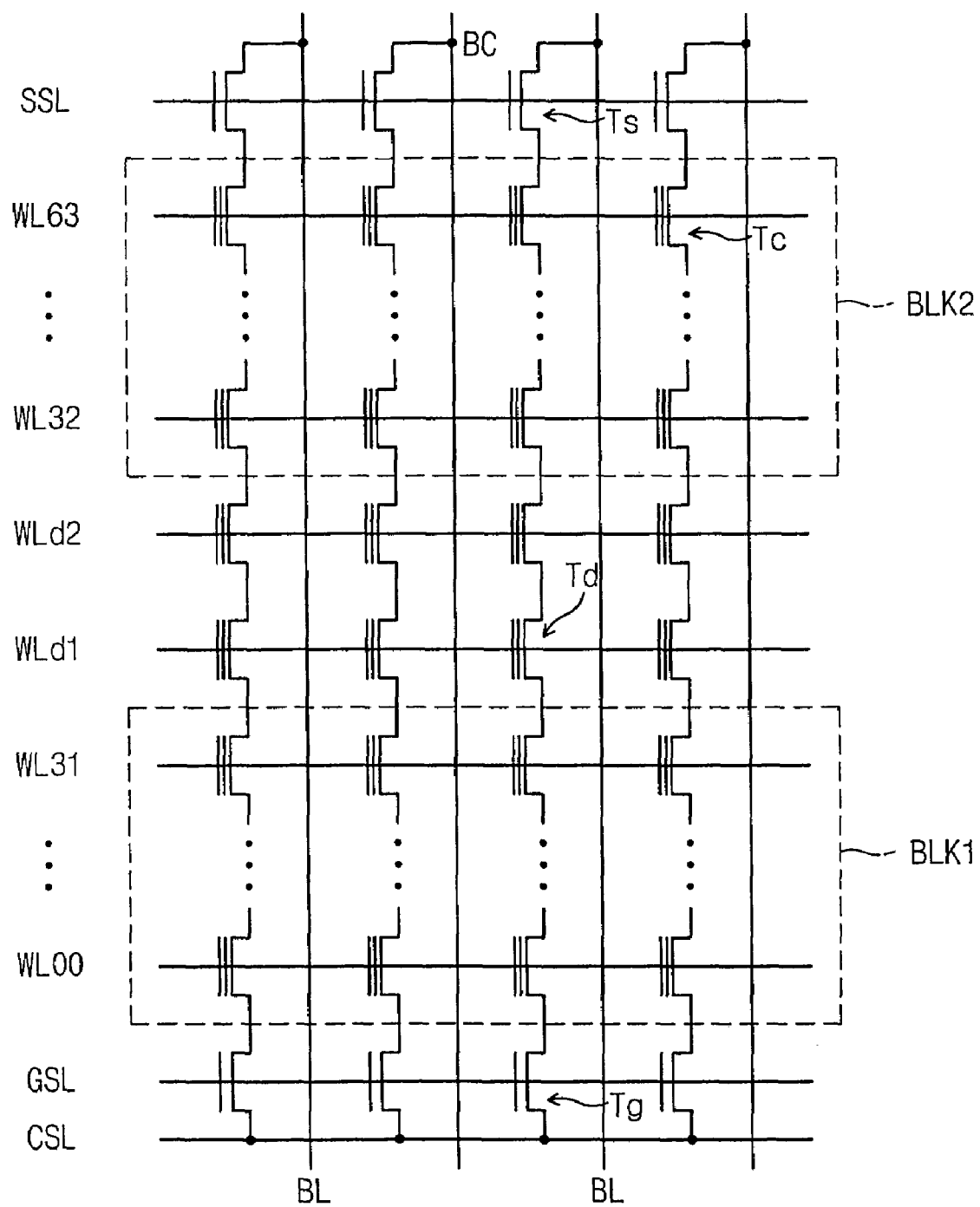
FIGS. 5A and 5B are circuit and sectional diagrams illustrating a NAND-type nonvolatile memory device in accordance with another embodiment of the invention.
Figures 5B, 6:
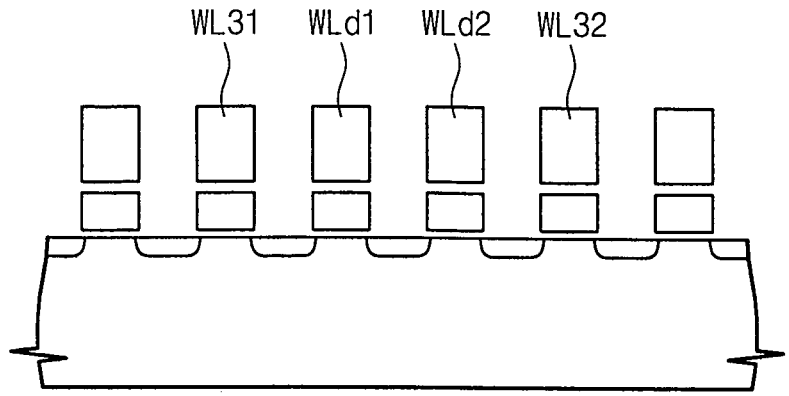
FIG. 6 is a table illustrating voltage conditions for various operations of the of the NAND-type nonvolatile memory device illustrated in FIGS. 5A through 5C.

FIG. 5A is a circuit diagram illustrating a memory cell array of a NAND-type nonvolatile memory device in accordance with another embodiment of the present invention, and FIG. 5B is a sectional diagram illustrating the NAND-type nonvolatile memory device of FIG. 5A.

The memory cell array illustrated in FIG. 5A is similar to the memory cell array illustrated in FIG. 3A, except that in FIG. 5A, erase blocks BLK1 and BLK2 are separated by two dummy word lines WLd1 and WLd2. More particularly, each NAND string in the memory cell array illustrated in FIG. 5A includes two dummy transistors Td, which are respectively connected to dummy word lines WLd1 and WLd2.

Like the memory cell array of FIG. 3A, the memory cell array of FIG. 5A is shown with 64 pages forming two erase blocks, and dummy word lines arranged between word lines WL31 and WL32. However, the number of pages in the memory cell array can be varied, the number of pages per memory block can be varied, the number and arrangement of memory blocks can be varied, the number and arrangement of dummy cells per NAND string can be varied, and so on.

Referring to FIG. 5B, dummy word lines WLd1 and WLd2 are formed on semiconductor substrate 10. Dummy word lines WLd1 and WLd2 are arranged between word line WL31 and word line WL32, forming a boundary between erase blocks BLK1 and BLK2. Dummy word lines WLd1 and WLd2 are formed with substantially the same structure as word lines WL00 through WL63. In addition, dummy word lines WLd1 and WLd2 and word lines WL00 through WL63 are arranged in a predetermined pitch from each other. In particular, adjacent word lines among word lines WL00 through WL63 may be separated from each other by minimum feature size F1, and dummy word lines WLd1 and WLd2 may be separated from each other and from respective word lines WL31 and WL32 by minimum feature size F1.

FIG. 6 is a table illustrating voltages used to operate the NAND-type nonvolatile memory device illustrated in FIGS. 5A and 5B. In particular, FIG. 6 illustrates voltages for program, read, erase, and erase verify operations of the NAND-type nonvolatile memory device.

Referring to FIG. 6, during the program operation, string select line SSL is driven with a power source voltage Vcc, ground select line GSL is driven with 0V, a selected word line W_sel among word lines WL00 through WL63 is driven with a program voltage Vpgm, unselected word lines WL_nosel among word lines WL00 through WL63 are driven with a pass voltage Vpass, first and second dummy word lines WL_dummy1 and WL_dummy2 (i.e., dummy word lines WLd1 and WLd2) are driven with pass voltage Vpass, selected bitlines BL_sel are driven with 0V, unselected bitlines BL_nosel are driven with power source voltage Vcc, common select line CSL is driven with 0V, and a bulk of the memory cell array receives 0V.

During the read operation, string select line SSL is driven with a read voltage Vread, ground select line GSL is driven with read voltage Vread, selected word line W_sel is driven with a reference voltage Vr, unselected word lines WL_nosel are driven with read voltage Vread, dummy word lines WL_dummy1 and WL_dummy2 are driven with read voltage Vread, selected bitlines BL_sel are driven with a bit line voltage Vbl, unselected bitlines BL_nosel are driven with 0V, common select line CSL is driven with 0V, and the bulk of the memory cell array receives 0V.

During the erase operation, string select line SSL is allowed to float, ground select line GSL is allowed to float, selected word line W_sel is driven with 0V, unselected word lines WL_nosel are allowed to float, first dummy word line WL_dummy1 is driven with a first coupling inhibition voltage Vdec1, second dummy word line WL_dummy2 is driven with a second coupling inhibition voltage Vdec2, selected bitlines BL_sel are allowed to float, unselected bitlines BL_nosel are allowed to float, common select line CSL is allowed to float, and the bulk of the memory cell array is driven with 20V.

During the erase verify operation, string select line SSL is driven with read voltage Vread, ground select line GSL is driven with read voltage Vread, selected word line W_sel is driven with 0V, unselected word lines WL_nosel are driven with read voltage Vread, dummy word lines WL_dummy1 and WL_dummy2 are driven with read voltage Vread, selected bitlines BL_sel are driven with bit line voltage Vbl, unselected bitlines BL_nosel are driven with 0V, common select line CSL is driven with 0V, and a bulk of the memory cell array receives 0V.

During the erase operation, coupling inhibition voltages Vdec1 and Vdec2 applied to dummy word lines WL_dummy1 and WL_dummy2, respectively, act to restrain mutual disturbance between memory cell transistors located in rows 31 and 32 of the memory cell array.

Where 20V is applied to the bulk of the memory cell array during the erase operation, potentials of floating gates in memory cell transistors Tc coupled to unselected word lines WL_nosel, which are allowed to float during the erase operation, are boosted up to inhibit erasure of memory cells connected to unselected word lines WL_nosel while memory cell transistors coupled to selected word line WL_sel are erased.

However, at a boundary between an unselected erase block and a selected erase block, electrical interactions between a selected word line closest to an unselected wordline may cause the program state of some unselected cells to be undesirably modified. Accordingly, the dummy word lines are placed between the boundary of adjacent erase blocks to prevent such disturbances from taking place.

Coupling inhibition voltages Vdec1 and Vdec2 preferably have intermediate levels between the voltage level applied to selected word lines WL_sel in a block being erased and the voltage level apparent at unselected word lines WL_nosel in a block not being erased.

In general, the coupling inhibition voltage corresponding to the dummy word line closest to the block being erased will have a voltage level relatively closer to the voltage level of selected word lines WL_sel, and the coupling inhibition voltage corresponding to the dummy word line closest to the block not being erased will have a voltage level relatively closer to the voltage level of unselected word lines WL_nosel. For example, where erase block BLK1 is being erased, coupling inhibition voltage Vdec1 preferably has a level relatively closer to the voltage level applied to selected word lines WL_sel in erase block BLK1 and coupling inhibition voltage Vdec2 preferably has a level relatively closer to the voltage level apparent at unselected word lines WL_nosel in erase block BLK2.

Figure 7A:
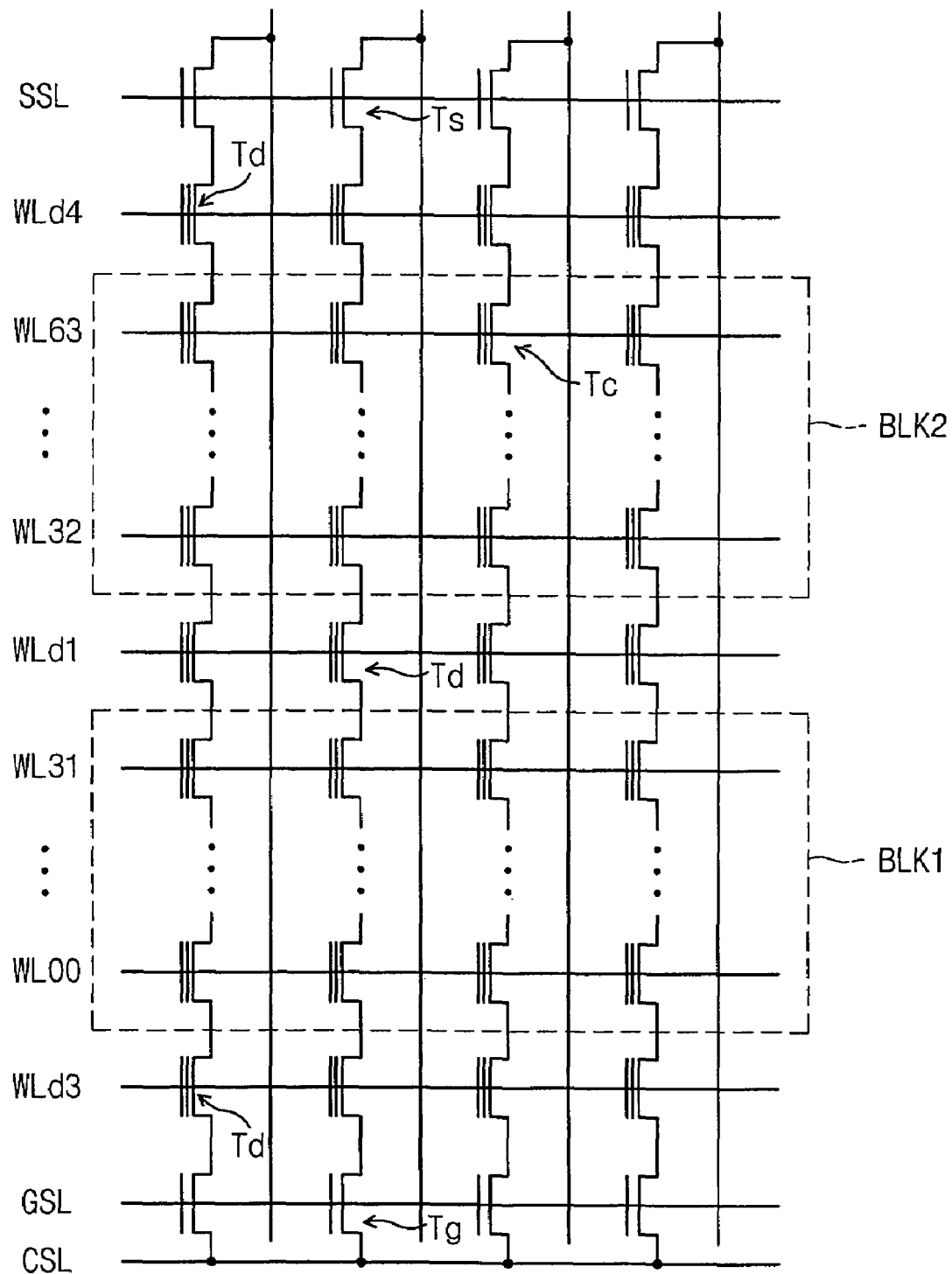
FIGS. 7A and 7B are circuit and sectional diagrams illustrating a NAND-type nonvolatile memory device in accordance yet another embodiment of the invention.
Figures 7B, 8:
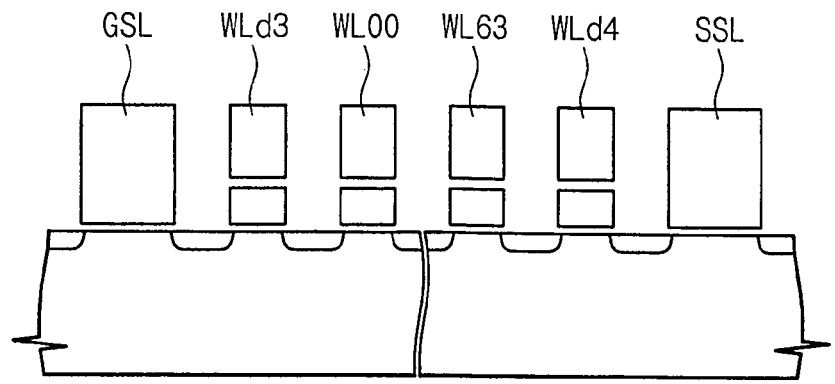
FIG. 8 is a table illustrating voltage conditions for various operations of the NAND-type nonvolatile memory device illustrated in FIGS. 7A through 7C.

FIG. 7A is a circuit diagram illustrating a memory cell array of a NAND-type nonvolatile memory device in accordance with still another embodiment of the present invention, and FIG. 7B is a sectional diagram illustrating the NAND-type nonvolatile memory device of FIG. 7A.

Referring to FIG. 7A, the memory cell array comprises a plurality of NAND strings each comprising a plurality of memory cell transistors Tc connected in series between a ground select transistor Tg and a string select transistor Ts. In FIG. 7A, each NAND string comprises 64 memory cell transistors Tc connected in series and divided into two erase blocks BLK1 and BLK2. Erase block BLK1 comprises 32 pages of memory cell transistors Tc connected to respective word lines WL00 through WL31 and erase block BLK2 comprises 32 pages connected to respective word lines WL32 through WL63.

Each NAND string in the memory cell array of FIG. 7A comprises a dummy transistor Td connected between the ground select transistor Tg of the NAND string and the memory cell transistor Tc of the NAND string connected to word line WL00. Each NAND string further comprises a dummy transistor Td connected between the memory cell transistors Tc of the NAND string connected to word lines WL31 and WL32, respectively. Each NAND string still further comprises a dummy transistor Td connected between the string select transistor Ts of the NAND string and the memory cell transistor Tc of the NAND string connected to word line WL63.

In contrast to the embodiments illustrated in FIGS. 3A and 5A, the dummy transistors Td illustrated in FIG. 7A are disposed between the memory cell transistors Tc and ground select transistors Tg, as well as between memory cell transistors Tc and string select transistors Ts. In other words, each NAND string is separated from its ground select transistor Tg and its string select transistor Ts by respective dummy transistors Td.

Like the memory cell arrays of FIGS. 3A and 5A, the memory cell array of FIG. 7A is shown with 64 pages forming two erase blocks, and dummy word lines arranged between word lines WL31 and WL32. In addition, dummy word lines are arranged between the respective string select transistors Ts and ground select transistors Tg. However, the number of pages in the memory cell array can be varied, the number of pages per memory block can be varied, the number and arrangement of memory blocks can be varied, the number and arrangement of dummy cells per NAND string can be varied, and so on.

Referring to FIGS. 7A and 7B, the memory cell array is formed on a semiconductor substrate 10. A first dummy word line WLd1 is formed on semiconductor substrate 10 to divide word lines WL00 through WL63 into erase blocks BLK1 and BLK2. A third dummy word line WLd3 is connected between a gate select line GSL connected to gate select transistors Tg and word line WL00, and a fourth dummy word line WLd4 is connected between a string select line SSL connected to string select transistors Ts and word line WL63.

Dummy word lines WLd1, WLd3, and WLd4 are formed with substantially the same structure as word lines WL00 through WL63. Dummy word lines WLd1, WLd3, and WLd4, and word lines WL00 through WL64 may be arranged with a predetermined pitch from each other and may be separated from each other by a minimum feature size F1.

FIG. 8 is a table illustrating voltages used to operate the NAND-type nonvolatile memory device illustrated in FIGS. 7A and 7B. In particular, FIG. 8 illustrates voltages for program, read, erase, and erase verify operations of the NAND-type nonvolatile memory device.

Referring to FIG. 8, during the program operation, string select line SSL is driven with a power source voltage Vcc, ground select line GSL is driven with 0V, a selected word line W_sel among word lines WL00 through WL63 is driven with a program voltage Vpgm, unselected word lines WL_nosel among word lines WL00 through WL63 are driven with a pass voltage Vpass, a dummy word line WL_dummy (i.e., dummy word line WLd1) and dummy word lines WLd_sel and WLd_nosel adjacent to selection lines SSL and GSL are controlled as deselected word lines, being supplied with the pass voltage Vpass, selected bitlines BL_sel are driven with 0V, unselected bitlines BL_nosel are driven with power source voltage Vcc, common select line CSL is driven with 0V, and a bulk of the memory cell array receives 0V.

During the read operation, string select line SSL is driven with a read voltage Vread, ground select line GSL is driven with read voltage Vread, selected word line W_sel is driven with a reference voltage Vr, unselected word lines WL_nosel are driven with read voltage Vread, dummy word lines WL_dummy, WLd_sel, and WLd_nosel are controlled as deselected word lines, being driven with read voltage Vread, selected bitlines BL_sel are driven with a bit line voltage Vbl, unselected bitlines BL_nosel are driven with 0V, common select line CSL is driven with 0V, and the bulk of the memory cell array receives 0V.

During the erase operation, string select line SSL is allowed to float, ground select line GSL is allowed to float, selected word line W_sel is driven with 0V, unselected word lines WL_nosel are allowed to float, dummy word lines WL_dummy, and dummy word line WLd_sel adjacent to the selected erase block are supplied with coupling inhibition voltages Vdec1 and Vdec2, respectively, dummy word line WLd_nosel adjacent to the unselected erase block is allowed to float, selected bitlines BL_sel are allowed to float, unselected bitlines BL_nosel are allowed to float, common select line CSL is allowed to float, and the bulk of the memory cell array is driven with 20V. During the erase operation, coupling inhibition voltages Vdec1 and Vdec2 act to restrain mutual disturbance between memory cell transistors located at the boundary of the selected and deselected erase blocks.

During the erase verify operation, string select line SSL is driven with read voltage Vread, ground select line GSL is driven with read voltage Vread, selected word line W_sel is driven with 0V, unselected word lines WL_nosel are driven with read voltage Vread, dummy word lines WL_dummy, WLd_sel, and WLd_nosel are driven with read voltage Vread, selected bitlines BL_sel are driven with bit line voltage Vbl, unselected bitlines BL_nosel are driven with 0V, common select line CSL is driven with 0V, and a bulk of the memory cell array receives 0V.

Where 20V is applied to the bulk of the memory cell array during the erase operation, potentials of floating gates in memory cell transistors Tc coupled to unselected word lines WL_nosel, which are allowed to float during the erase operation, are boosted up to inhibit erasure of memory cells connected to unselected word lines WL_nosel while memory cell transistors coupled to selected word line WL_sel are erased.

However, at a boundary between an unselected erase block and a selected erase block, electrical interactions between a selected word line closest to an unselected wordline may cause the program state of some unselected cells to be undesirably modified. Accordingly, dummy word line WL_dummy is placed between the boundary of adjacent erase blocks to prevent such disturbances from taking place.

Coupling inhibition voltage Vdec1 preferably has an intermediate level between the voltage level applied to selected word lines WL_sel in a block being erased and the voltage level apparent at unselected word lines WL_nosel in a block not being erased. If coupling inhibition voltage Vdec1 is too close to the voltage level apparent at unselected word lines WL_nosel, the erase operation applied to the memory cell transistors near dummy word line WL_dummy may be undesirably slowed down. Furthermore, the erase operation may result in undesirably large gaps between threshold voltages of the memory cell transistors in the erased block. These problems are more serious than effects caused in unselected erase blocks by increasing coupling inhibition voltage Vdec1. Accordingly, coupling inhibition voltage Vdec1 is preferably set near to a voltage applied to selected word line WL_sel during the erase operation, e.g., 0V through Vcc.

During the erase operation, string and ground select lines SSL and GSL are floated. Thus, the dummy word line arranged between a selected erasing block and string select transistor SSL or ground select transistor GSL is supplied with coupling inhibition voltage Vdec2. Coupling inhibition voltage Vdec2 preferably has a level between respective potentials of ground and string select lines GSL and SSL.

Figure 9:
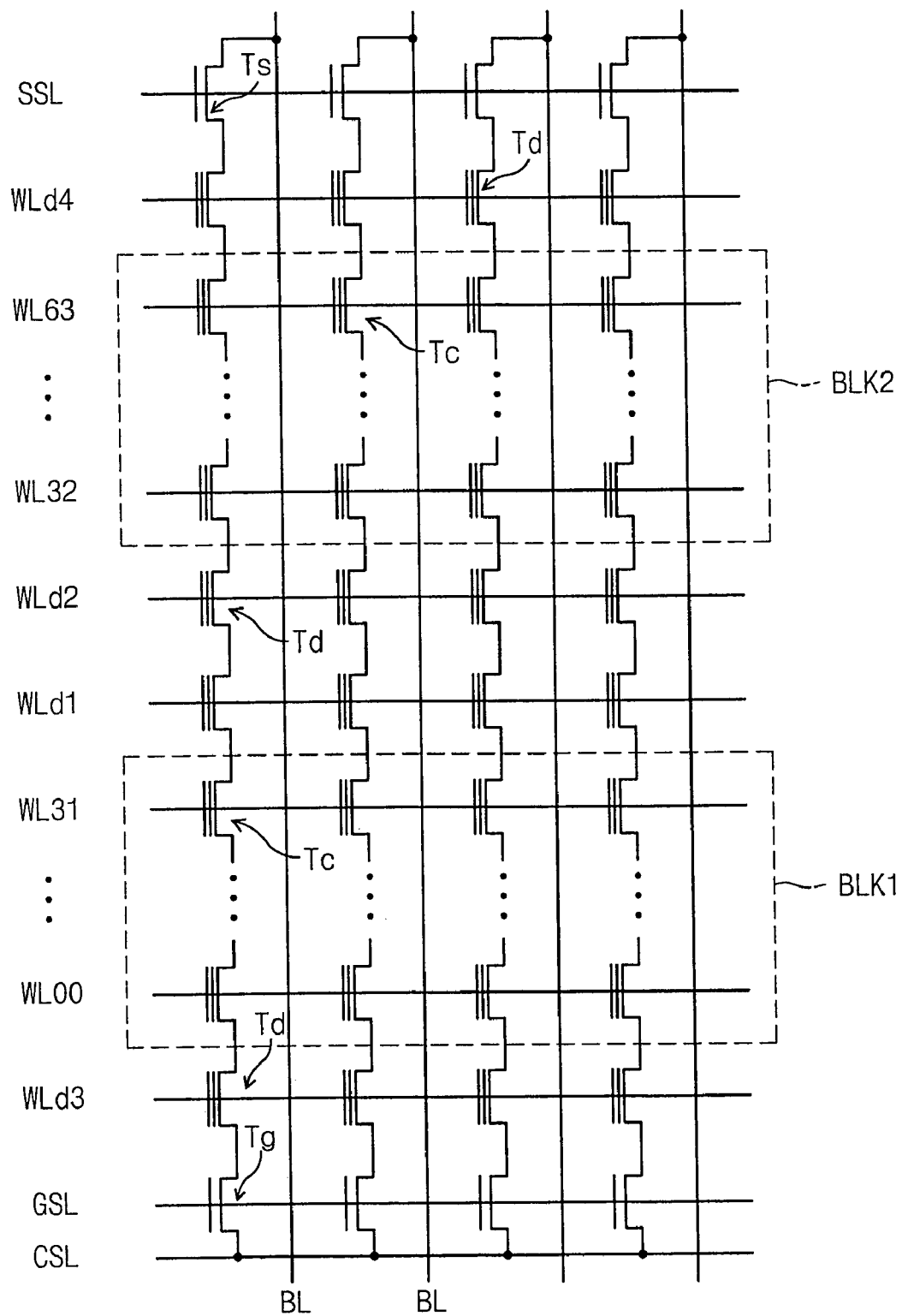
FIG. 9 is a circuit diagram illustrating a NAND-type nonvolatile memory device in accordance with still another embodiment of the invention.

FIG. 9 is a circuit diagram illustrating a memory cell array of a NAND-type nonvolatile memory device in accordance with still another embodiment of the present invention.

Referring to FIG. 9, the memory cell array is similar to the memory cell array of FIG. 7A, except that two dummy word lines and corresponding dummy memory cells are arranged between erase blocks BLK1 and BLK2. In particular, first and second dummy word lines WLd1 and WLd2 and associated dummy transistors Td are arranged between word lines WL31 and WL32.

Like the memory cell arrays of FIGS. 3A, 5A, and 7A, the number and arrangement of memory cell transistors Tc, memory blocks, and dummy transistors Td in the memory cell array of FIG. 9 can be varied.

FIG. 10 is a table illustrating voltages used to operate the NAND-type nonvolatile memory device illustrated in FIG. 9. In particular, FIG. 10 illustrates voltages for program, read, erase, and erase verify operations of the NAND-type nonvolatile memory device.

During the program operation, the same voltages are used to operate the memory cell array of FIG. 9 as the memory cell array of FIG. 7A, except that in FIG. 9, dummy word lines WL_dummy1 and WL_dummy2 (i.e., WLd1 and WLd2) dividing erase blocks BLK1 and BLK2 and dummy word lines WLd_sel and WLd_nosel adjacent to the selection lines are all controlled as deselected word lines, being supplied with the pass voltage Vpass.

Similarly, during the read and erase verify operations, the same voltages are used to operate the memory cell array of FIG. 9 as the memory cell array of FIG. 7A, except that dummy word lines, WL_dummy1, WL_dummy2, WLd_sel, and WLd_nosel, are all controlled as deselected word lines, being supplied with read voltage Vread.

Likewise, in the erase operation, the same voltages are used to operate the memory cell array of FIG. 9 as the memory cell array of FIG. 7A, except that dummy word lines WL_dummy1 and WL_dummy2 are respectively supplied with coupling inhibition voltages Vdec1 and Vdec2. Coupling inhibition voltages Vdec1 and Vdec2 act to restrain mutual disturbance between memory cell transistors locating at the boundary of the selected and deselected erasing blocks.

Where 20V is applied to the bulk of the memory cell array during the erase operation, potentials of floating gates in memory cell transistors Tc coupled to unselected word lines WL_nosel, which are allowed to float during the erase operation, are boosted up to inhibit erasure of memory cells connected to unselected word lines WL_nosel while memory cell transistors coupled to selected word line WL_sel are erased.

However, at a boundary between an unselected erase block and a selected erase block, electrical interactions between a selected word line closest to an unselected wordline may cause the program state of some unselected cells to be undesirably modified. Accordingly, the dummy word lines are placed between the boundary of adjacent erase blocks to prevent such disturbances from taking place.

Coupling inhibition voltages Vdec1 and Vdec2 preferably have intermediate levels between the voltage level applied to selected word lines WL_sel in a block being erased and the voltage level apparent at unselected word lines WL_nosel in a block not being erased. In general, the coupling inhibition voltage corresponding to the dummy word line closest to the block being erased will have a voltage level relatively closer to the voltage level of selected word lines WL_sel, and the coupling inhibition voltage corresponding to the dummy word line closest to the block not being erased will have a voltage level relatively closer to the voltage level of unselected word lines WL_nosel.

For example, where erase block BLK1 is being erased, coupling inhibition voltage Vdec1 preferably has a level relatively closer to the voltage level applied to selected word lines WL_sel in erase block BLK1 and coupling inhibition voltage Vdec2 preferably has a level relatively closer to the voltage level applied to unselected word lines WL_nosel in erase block BLK2. If a selected word line is adjacent to an unselected word line, there would be induced disturbance in erasing and inhibiting erasure at memory cell transistors placed on the boundary of selected and deselected erasing blocks. However, embodiments of the invention provide dummy word lines, each comprising dummy transistors, between the selected and deselected erasing blocks. Thus, it is possible to reduce disturbance in erasing and inhibiting erasure at memory cell transistors placed on the boundary of selected and deselected erasing blocks.

Preferably, dummy word line WLd_sel adjacent to the selected erase block is supplied with third coupling inhibition voltage Vdec3 close to a voltage applied to selected word line WL_sel, while dummy word line WLd_nosel adjacent to the unselected erase block is supplied with coupling inhibition voltage Vdec4 close to a voltage apparent on the corresponding string select or gate select line. For instance, coupling inhibition voltage Vdec3 may be set to 0V and coupling inhibition voltage Vdec4 may be set to the level of an erase voltage.

Using techniques provided by various embodiments of the invention, the number of memory cell transistors in each NAND string of a nonvolatile memory device can be increased without seriously impairing the efficiency of the device's file system by dividing up erase blocks as described above. Moreover, using one or more pages of dummy transistors to separate adjacent erase blocks also prevents disturbance between memory cell transistors in the adjacent erase blocks during erase operations.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile memory device, comprising:
a memory cell array, comprising:
a plurality of NAND strings, wherein each NAND string comprises:
a plurality of memory cell transistors connected in series between a string select transistor and a ground select transistor; and
a first dummy transistor connected in series between two of the plurality of memory cell transistors;
wherein the first dummy transistor in the plurality of NAND strings divides the memory cell array into multiple erase blocks; and
wherein during an erase operation applied to a selected erase block among the multiple erase blocks, a coupling inhibition voltage is applied to respective gate electrodes of at least one first dummy transistor in the plurality of NAND cell strings,
wherein the coupling inhibition voltage has a level between ground and a voltage level apparent on word lines of unselected erase blocks among the multiple erase blocks.

2. The nonvolatile memory device of claim 1, wherein during the erase operation:
an erase voltage is applied to a substrate of the memory cell array;
a ground voltage is applied to gate electrodes of memory cell transistors included in the selected erase block; and
voltage levels of gate electrodes of memory cell transistors included in the unselected erase blocks are allowed to float.

3. The nonvolatile memory device of claim 1, wherein each of the NAND strings further comprises:
a common source line connected to the ground select transistor;
a corresponding bit line connected to the string select transistor;
a source side dummy transistor connected in series between the ground select transistor and one of the plurality of memory cell transistors adjacent to the ground select transistor; and
a bit line side dummy transistor connected in series between the string select transistor and another one of the plurality of memory cell transistors adjacent to the string select transistor.

4. The nonvolatile memory device of claim 1, wherein each NAND cell string further comprises:
a second dummy transistor connected in series with the first dummy transistor between the two of the plurality of memory cell transistors.

5. The nonvolatile memory device of claim 4, wherein the first dummy transistor of each NAND string is adjacent to the selected one of the multiple erase blocks and the second dummy transistor of each NAND string is adjacent to an unselected one of the multiple erase blocks; and
wherein during the erase operation:
a first coupling inhibition voltage is applied to the first dummy transistor of each NAND string and a second coupling inhibition voltage is applied to the second dummy transistor of each NAND string;
the first and second coupling inhibition voltages have respective levels between ground and a voltage level apparent on the word lines of the unselected one of the multiple erase blocks; and
the first coupling inhibition voltage has a lower level than the second coupling inhibition voltage.

6. The nonvolatile memory device of claim 1, wherein within each NAND string, each memory cell transistor is separated from adjacent memory cell transistors by a first interval, and the first dummy transistor is separated from adjacent memory cell transistors by a second interval, and the first interval is smaller than the second interval.

7. The nonvolatile memory device of claim 1, wherein during an erase-verify operation, within each NAND string, a turn-on voltage is applied to respective gate electrodes of memory cell transistors in the selected erase block and the first dummy transistor, and a read voltage is applied to respective gate electrodes of memory cell transistors in the unselected erase blocks.

8. A nonvolatile memory device, comprising:
a memory cell array, comprising:
ground and string select lines formed on a semiconductor substrate and extending in a first direction;
a plurality of word lines formed on the semiconductor substrate between the ground and string select lines; and
at least one dummy word line disposed between two of the plurality of word lines,
wherein the at least one dummy word line divides the memory cell array into multiple erase blocks,
during an erase operation applied to a selected erase block among the multiple erase blocks, and
a coupling inhibition voltage is applied to the at least one dummy word line,
wherein during the erase operation an erase voltage is applied to the semiconductor substrate of the memory cell array, a ground voltage is applied to the word lines of the selected erase block, and voltage levels of the word lines of the unselected erase blocks are allowed to float.

9. The nonvolatile memory device of claim 8, wherein the coupling inhibition voltage has a level between ground and a voltage level apparent on the word lines of unselected erase blocks among the multiple erase blocks.

10. The nonvolatile memory device of claim 8, wherein the at least one dummy word line comprises two or more dummy word lines arranged adjacent to each other between two of the multiple erase blocks.

11. The nonvolatile memory device of claim 10, wherein during the erase operation, the two or more dummy word lines receive respective first and second coupling inhibition voltages, wherein the first and second coupling inhibition voltages have respective levels between ground and a voltage level apparent on the word lines of unselected erase blocks among the multiple erase blocks, and the respective levels of the first and second coupling inhibition voltages increase according to the relative distance of each of the two or more dummy word lines from the selected erase block.

12. The nonvolatile memory device of claim 8, further comprising:
a source side dummy word line disposed between the ground select line and one of the plurality of word lines adjacent to the ground select line; and
a bit line side dummy word line disposed between the string select line and another one of the plurality of the word lines adjacent to the string select line.

13. The nonvolatile memory device of claim 12, wherein when the source side dummy word line is adjacent to the selected erase block, the source side dummy word line is supplied with the coupling inhibition and the bit line side dummy word line is allowed to float.

14. The nonvolatile memory device of claim 8, wherein each of the plurality of word lines is separated from the adjacent word lines by a first interval, and the at least one dummy word line is separated from the adjacent word lines by a second interval, wherein the first interval is smaller than the second interval.

15. The nonvolatile memory device of claim 1, wherein the first dummy transistors in the plurality of NAND strings divides the memory cell array into first and second erase blocks respectively having an equal number of memory cell transistors.

16. The nonvolatile memory device of claim 4, wherein the series combination of first and second dummy transistors in the plurality of NAND strings divides the memory cell array into first and second erase blocks respectively having an equal number of memory cell transistors.

17. The nonvolatile memory device of claim 8, wherein the dummy word line divides the memory cell array into first and second erase blocks respectively having an equal number of memory cell transistors.

18. The nonvolatile memory device of claim 8, wherein the two or more lines divide the memory cell array into first and second erase blocks respectively having an equal number of memory cell transistors.

19. A nonvolatile memory device, comprising:
a memory cell array, comprising:
a plurality of NAND strings, wherein each NAND string comprises:
a plurality of memory cell transistors connected in series between a string select transistor and a ground select transistor; and
a first dummy transistor connected in series between two of the plurality of memory cell transistors;
wherein the first dummy transistors in the plurality of NAND strings divide the memory cell array into multiple erase blocks;
within each NAND string, each memory cell transistor is separated from adjacent memory cell transistors by a first interval, and the first dummy transistor is separated from adjacent memory cell transistors by a second interval greater than the first interval; and
during an erase operation applied to a selected erase block among the multiple erase blocks, a coupling inhibition voltage is applied to respective gate electrodes of at least one first dummy transistor in the plurality of NAND cell string, wherein the coupling inhibition voltage has a level between ground and a voltage level apparent on word lines of unselected erase blocks among the multiple erase blocks.

* * * * *